United States Patent [19]
Wagner et al.

[11] Patent Number: 5,311,149
[45] Date of Patent: May 10, 1994

[54] INTEGRATED PHASE LOCKED LOOP LOCAL OSCILLATOR

[75] Inventors: Gary L. Wagner, Menlo Park; Chung Y. Lau, Sunnyvale; Reed A. Parker, Saratoga, all of Calif.

[73] Assignee: Trimble Navigation Limited, Sunnyvale, Calif.

[21] Appl. No.: 30,678

[22] Filed: Mar. 12, 1993

[51] Int. Cl.$^5$ .......................... H03B 5/12; H03L 7/08; H04B 1/28

[52] U.S. Cl. ...................... 331/1 A; 331/18; 331/108 C; 331/117 R; 331/175; 455/260; 455/314

[58] Field of Search .............. 331/1 A, 18, 22, 30, 331/31, 108 C, 117 R, 175, 183; 455/256, 260, 285, 293, 314, 315, 316

[56] References Cited

U.S. PATENT DOCUMENTS

| | | | |
|---|---|---|---|
| 4,851,787 | 7/1989 | Martin | 331/1 A |
| 4,856,032 | 8/1989 | Klekotka et al. | 331/1 A X |
| 5,034,706 | 7/1991 | Betti et al. | 331/117 R |
| 5,187,450 | 2/1993 | Wagner et al. | 331/117 R X |
| 5,210,484 | 5/1993 | Remillard et al. | 455/316 X |

Primary Examiner—David Mis
Attorney, Agent, or Firm—Thomas E. Schatzel

[57] ABSTRACT

An embodiment of the present invention is a single-chip GPS receiver front-end comprising a radio frequency amplifier, a voltage-controlled oscillator operating at a first local oscillator frequency, a divide by seven and one-half counter for deriving a second local oscillator frequency from the first and a first and second mixer. The local oscillator frequency is mid-way between two carrier frequencies of interest that may be received by the radio frequency amplifier and the first mixer produces a first intermediate frequency. The second local oscillator frequency is then beat with the first intermediate frequency in the second mixer to produce a second intermediate frequency. A dual-conversion super heterodyne configuration is therefore employed in which the first and second local oscillator frequencies are derived from a single oscillator and the first local oscillator frequency is seven and one-half times the second local oscillator frequency.

9 Claims, 3 Drawing Sheets

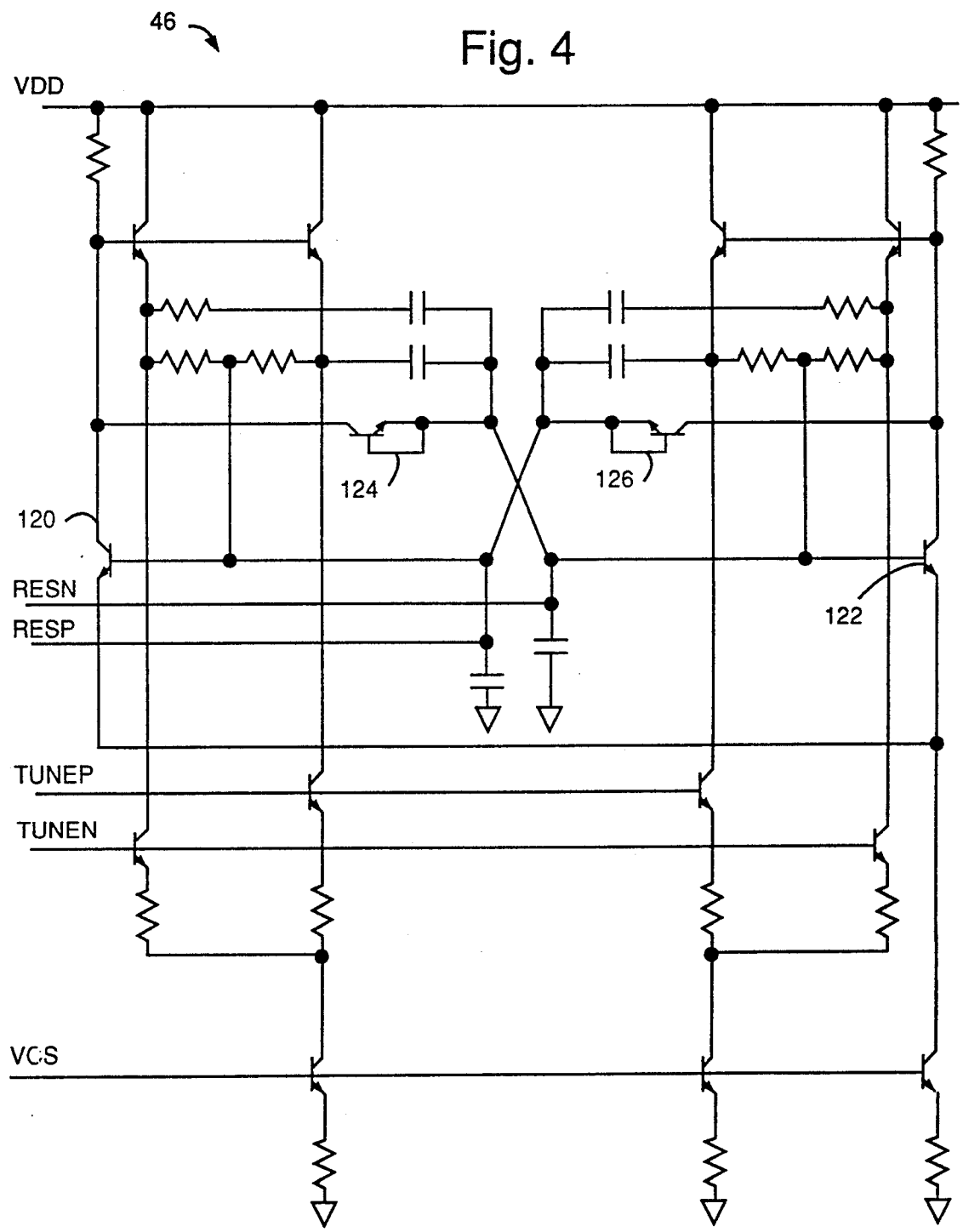

INTEGRATED PHASE LOCKED LOOP LOCAL OSCILLATOR

BACKGROUND OF THE INVENTION

1. Field of the Invention

The invention relates generally to integrated circuit semiconductor devices and more specifically to highly integrated implementations of global positioning system receivers.

2. Description of the Prior Art

The retail price of complete global positioning system (GPS) receivers, including hand-held, battery-operated portable systems, continues to decrease. Competitive pressures drive manufacturers to reduce construction costs while maintaining or actually improving functionality and reliability. Semiconductor fabrication advances have provided a vehicle to meet such goals, and to offer still smaller devices.

Semiconductor fabrication processes are not always uniform from batch to batch. Small process inconsistencies can manifest as variances in transistor characteristics, e.g., collector to base capacitance, also known as the Miller capacitance. In an integrated circuit implementation of a voltage controlled oscillator (VCO), such process variances can result in VCOs that fail to start oscillations due to insufficient loop gain. Capacitors can be added to increase positive feedback, but such capacitance additions can be excessive in the opposite extreme of process variation. A positive feedback capacitance that varies directly with the process variation is needed for high yield manufacturing of reliable components.

Dual-frequency carrier GPS receivers typically track a pair of radio carriers, L1 and L2, associated with GPS satellites to generate accumulated delta-range measurements (ADR) from P-code modulation on those carriers and at the same time track L1 C/A-code to generate code phase measurements. Carrier L1 is positioned at 1575.42 MHz and carrier L2 is positioned at 1227.78 MHz. Each carrier is modulated with codes that leave the GPS satellite at the same clock time. Since the ionosphere produces different delays for radio carriers passing through it having different radio frequencies, dual carrier receivers can be used to obtain real-time measurements of ionospheric delays at a user's particular position. The L1 and L2 ADR measurements are combined to generate a new L1 ADR measurement that has an ionospheric delay of the same sign as the ionospheric delay in the L1 pseudorange. Accurate ionospheric delay figures, if used in a position solution, can help produce much better position solutions. Without such real-time ionospheric delay measurements, mathematical models or measurements taken by third parties (which can be old) must be used instead.

With a highly-integrated GPS receiver implementation, it is desirable to incorporate a dual-conversion frequency plan that allows one set of intermediate frequencies (IF) to be processed, regardless of whether L1 or L2 has been selected. In a highly-integrated GPS receiver implementation, it is desirable to share one PLL that can generate both the required frequencies for the two carrier frequencies used in the dual conversion process.

The relative frequencies of the L1 and L2 carriers allow a super-heterodyne type of receiver to generate a first local oscillator (LO) frequency that is approximately midway between L1 and L2 such that it will produce near identical intermediate frequencies (IF). For L1, the difference between L1 at 1575.42 MHz and LO at 1401.6 MHz produces a first IF of 173.82 MHz. For L2, the difference between L2 at 1227.6 MHz and LO at 1401.6 MHz produces a first IF of −174 MHz. Therefore, to select L1 or L2, a radio frequency (RF) filter for each is switched in or out in front of the RF amplifier or in front of the first mixer. A second LO frequency of 186.88 MHz is desirable because such a frequency applied to a second mixer produces a second IF of 13.06 MHz for reception of L1, and 12.88 MHz for reception of L2. Preferably, both the first and second LO frequencies are produced by a single VCO, in order to save cost and in order to preserve phase coherence through two stages of conversion.

SUMMARY OF THE PRESENT INVENTION

It is therefore an object of the present invention to provide a dual-conversion down-converter integrated circuit.

Another object of the present invention is to provide a single integrated circuit device that integrates most of the radio frequency and intermediate frequency functions associated with GPS satellite signal reception.

It is another object of the present invention to provide a single integrated circuit device that has a frequency plan which invites minimum circuitry and therefore minimum cost and power requirements.

Briefly, an embodiment of the present invention is a single-chip GPS receiver front-end comprising a radio frequency amplifier, a voltage-controlled oscillator operating at a first local oscillator frequency, a divide by seven and one-half counter for deriving a second local oscillator frequency from the first and a first and second mixer.

An advantage of the present invention is that a single-chip GPS receiver front-end is provided that has substantially reduced manufacturing costs associated with its production.

Another advantage of the present invention is that a single-chip GPS receiver front-end is provided that is small in size.

Another advantage of the present invention is that a single-chip GPS receiver front-end is provided that has increased reliability over the prior art.

A further advantage of the present invention is that a single-chip GPS receiver front-end is provided that has a dual-conversion frequency plan which results in a minimum of circuitry and therefore minimum cost and power requirements.

Another advantage of the present invention is that an integrated circuit is provided that convert both L1 and L2 radio frequencies in a down-conversion to roughly the same intermediate frequency.

These and other objects and advantages of the present invention will no doubt become obvious to those of ordinary skill in the art after having read the following detailed description of the preferred embodiment which is illustrated in the drawing figure.

IN THE DRAWINGS

FIG. 4 is a simplified partial schematic diagram of a voltage controlled oscillator included in the receiver of FIG. 1.

DETAILED DESCRIPTION OF THE PREFERRED EMBODIMENT

Figure 1:
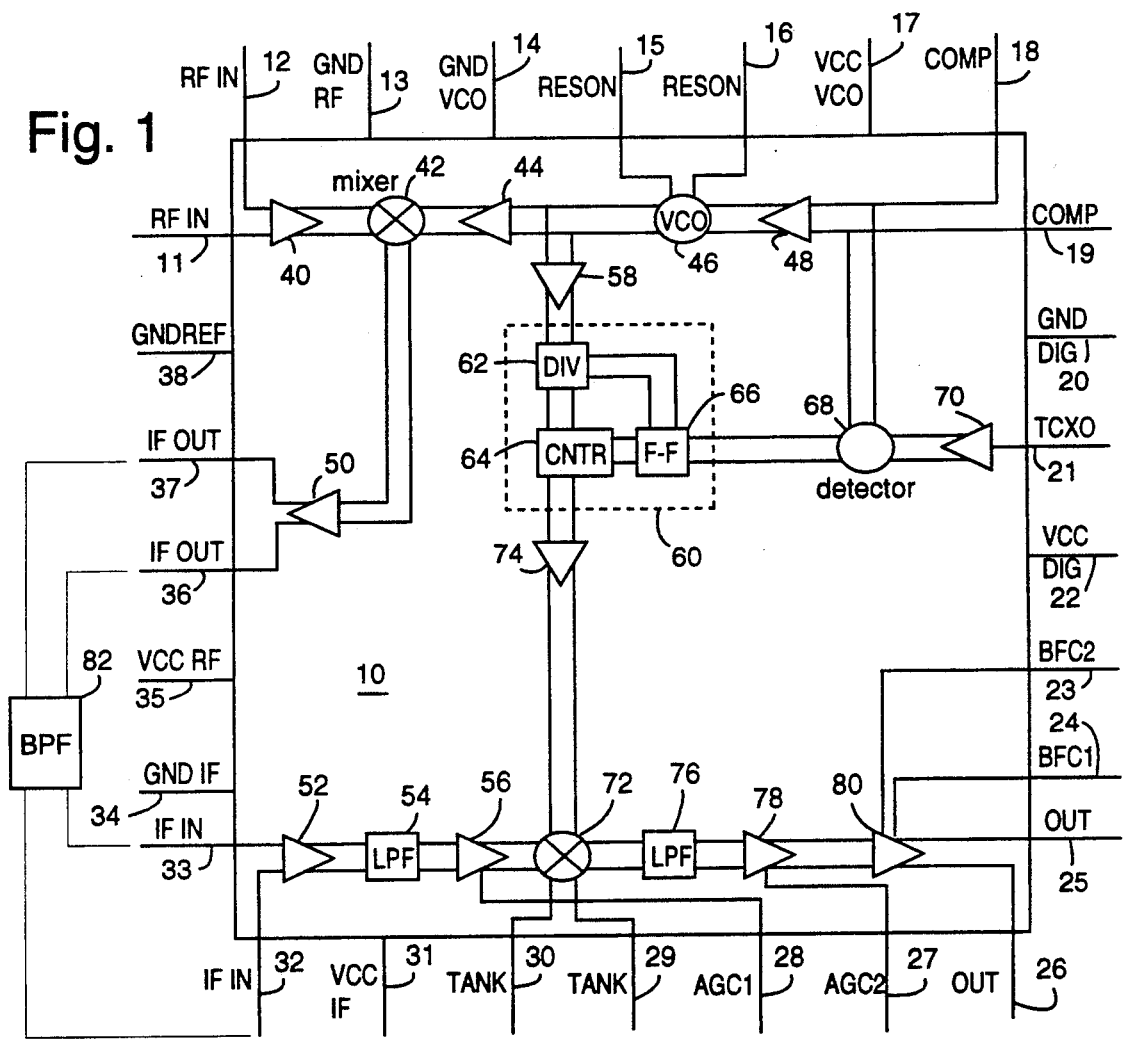
FIG. 1 is a block diagram of a dual-conversion integrated circuit receiver embodiment of the present invention.

FIG. 1 illustrates a precision-code (P-code) GPS receiver front-end chip, referred to by the general reference number 10. Chip 10 is comprised of a plurality of input/output (I/O), power and ground pins 11-38, a radio frequency (RF) amplifier 40, a first intermediate frequency (IF) mixer 42, a first local oscillator (LO) buffer 44, a voltage controlled oscillator (VCO) 46, a phase locked loop (PLL) amplifier 48, an IF output amplifier 50, an IF input amplifier 52, a first IF low pass filter (LPF) 54, a first IF amplifier 56, a VCO buffer 58 and a high-speed digital divider 60. Divider 60 includes a three-four divider 62, a synchronous counter 64 and a flip-flop 66. Synchronous counter 64 provides a divide-by-two signal for the second LO. A divide-by-four signal feeds the next stage, and a four-state feedback signal is used to control the three-four divider. Flip-flop 66 provides a simple divide-by-two signal output for phase-frequency detection.

Chip 10 further includes a PLL phase-frequency detector 68, a temperature controlled crystal oscillator (TCXO) buffer 70, a second IF mixer 72, a second LO buffer 74, a second IF LPF 76, a second IF amplifier 78 and an output amplifier 80. An external band pass filter (BPF) 82 is connected to chip 10. Fully-differential signal paths are provided throughout to provide noise immunity and to insure stability of high-gain amplifiers.

In operation, the VCO has a nominal operating frequency of 1.4016 gigahertz (GHz). An external TCXO signal of 46.72 MHz is applied to pin 21. RF input pins 11 and 12 receive either a GPS L1 carrier signal at 1575.42 MHz or an L2 carrier signal at 1227.6 MHz as a result of switching RF bandpass filters in or out. First IF mixer 42 produces a first IF at 173.82 MHz, for L1, and 174.00 MHz for L2 to be input to IF amplifier 50. External BPF 82 removes the unwanted image frequency. LPF 54 removes the RF and LO frequencies. Second IF mixer 72 receives a second LO signal at 186.88 MHz from buffer 74 and produces a second IF at 13.06 MHz for L1 and 12.88 MHz for L2. Automatic gain control is applied to amplifiers 56 and 78 to keep the second IF output at an approximate constant amplitude at pins 25 and 26. Divider 60 has the function of dividing by three or dividing by four and has two main tasks. The first is to divide the 1.4016 GHz signal from VCO buffer 58 down to a 186.88 MHz signal. A fractional N-divider configuration is used to provide the second LO signal to buffer 74. The 186.88 MHz signal is further divided down to a 46.72 MHz signal for use in a phase locked loop circuit.

Figure 2:
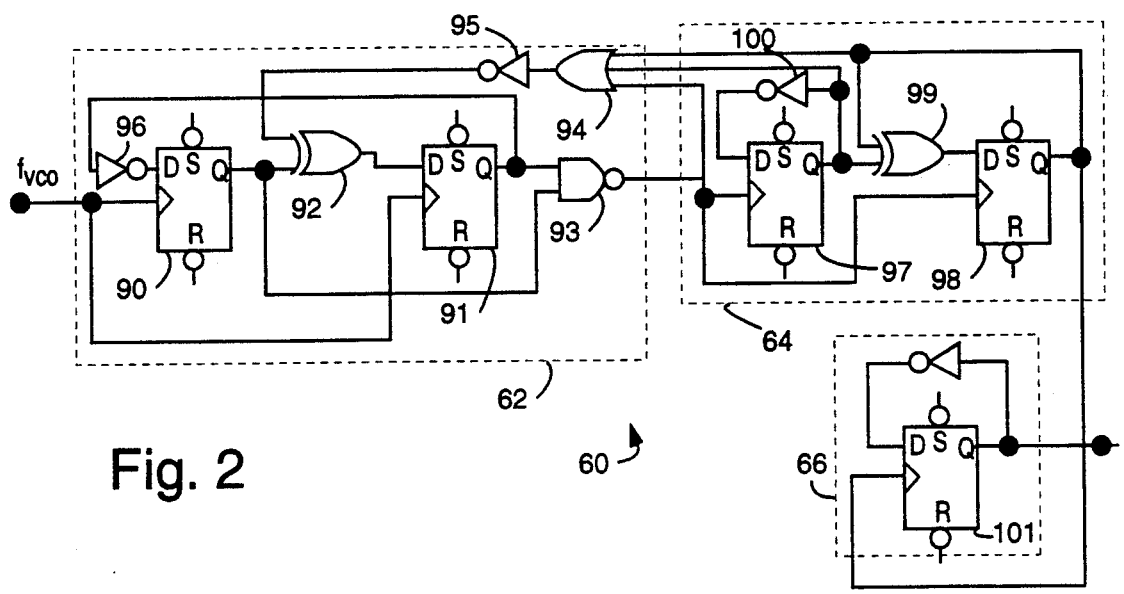
FIG. 2 is a schematic of a pulse-swallowing counter included in the receiver of FIG. 1.

In FIG. 2, the divide by three-four circuit 62 is shown to comprise a pair of flip-flops 90 and 91, a two-input XOR gate 92 for mode control, a two-input NAND gate 93 for generating an output signal and some combinatorial logic gates 94-96 that provide the correct state transition flow. The output of NAND gate 93 goes LOW when both flip-flops 90 and 91 have their "Q" outputs at a logic ONE (a one-one state). If all three "mode control inputs" at OR gate 94 are at logic ZERO, flip-flops 90 and 91 will produce such a one-one state every third clock cycle, yielding a divide-by-three function. When any of the mode control inputs is a logic HIGH, the one-one state will occur every fourth clock cycle, yielding a divide-by-four counter. Under normal operation, the counter 64 outputs a divide-by-three command state every fourth output pulse from the three-four counter 62, so a VCO clock is divided once by three, and three times by four, and repeats. The net effect is a divide by fifteen, with a dither that filters out completely in the phase locked loop.

The synchronous counter comprises a pair of flip-flops 97 and 98, and some combinatorial logic including a XOR gate 99 and an inverter 100 to provide the correct state transition. The output of flip-flop 97 divides its incoming clock signal by two to generate the second LO frequency. Due to the divide pattern of the high speed counter 62, the output from flip-flop 97 appears to successively divide-by-seven, divide-by-eight, divide-by-seven, divide-by-eight and so on. The output of flip-flop 98 divides the output of flip-flop 97 by two to provide a divide-by-fifteen output. In addition, the outputs from flip-flops 97 and 98 are both fed back to the high speed counter 62 to generate a divide-by-three command every fourth input clock pulse. A flip-flop 101 is configured as a simple divide-by-two to provide a divide-by-thirty signal to the phase-frequency detector 68.

Figure 3:
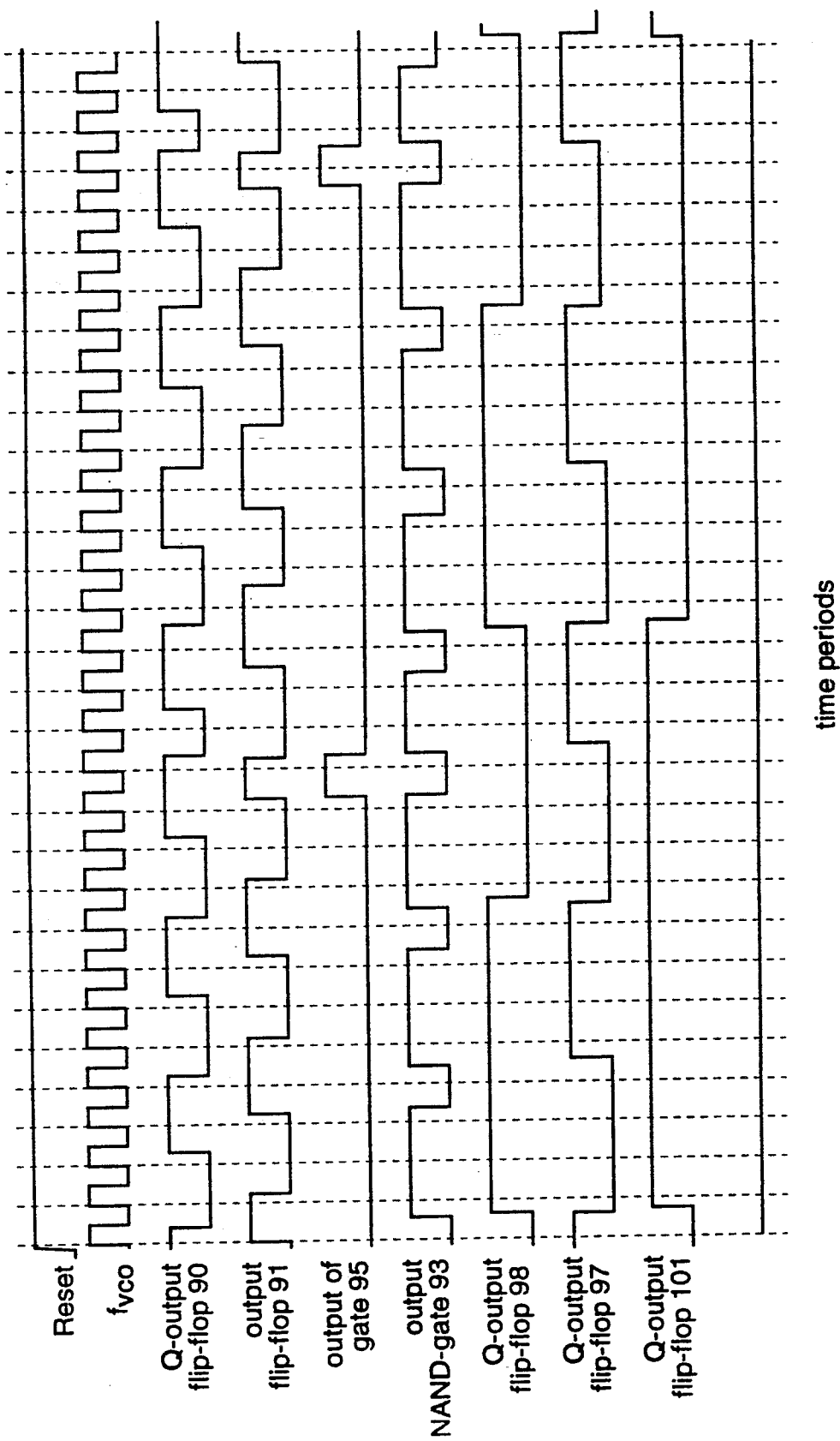
FIG. 3 is a logic timing diagram for the counter of FIG. 2.

FIG. 3 illustrates the timing of signals within divider 60.

FIG. 4 illustrates a pair of cross-coupled transistors 120 and 122 in a positive feedback configuration. This circuit forms the basis of VCO 46. A similar circuit is described further in U.S. Pat. No. 5,187,450, issued Feb. 16, 1993, to two of the present inventors, Gary L. Wagner and Chung Y. Lau and a third person, Eric B. Rodal. Such patent is incorporated herein by reference as if fully set forth. Transistors 120 and 122 are provided with positive feedback capacitance in the form of a pair of transistors 124 and 126 that each have their base electrodes connected to their emitter electrodes. Transistors 124 and 126 will always be turned off due to the zero base-emitter voltage, but each will nevertheless exhibit a finite base-to-collector capacitance.

Certain semiconductor fabrication process variations can result in transistors 120 and 122 having increased levels of collector-to-base capacitance ($C_{cb}$), e.g., Miller capacitance ($C_m$). To improve the frequency stability of VCO 46, these increased capacitance levels must be matched with similar increases in positive feedback capacitance. Preferably, transistors 120, 122, 124 and 126 are all fabricated by the same process steps. This will result in automatic increases and decreases in positive feedback capacitance that track the varying levels of Miller capacitance in transistors 120 and 122. Circuit trim is therefore self-correcting.

In summary, the RF signal input at pins 11 and 12 (FIG. 1) can be either a GPS L1 or L2 carrier signal. The output of first mixer 42 is an IF signal at 173.82 MHz or 174 MHz, which leaves the chip 10 as a pair of differential signals (IF OUT pin 36, IF OUT pin 37) so that they can be bandpass filtered outside of the chip 10. The VCO 46, which is the local oscillator to the first mixer 42, has a nominal frequency of 1.4016 GHz. A resonator comprising a transmission line outside chip 10 is connected between pins 15 and 16. The VCO output is frequency divided by seven and one-half to obtain the 186.88 MHz LO signal for the second mixer 72. The first IF signal, after being bandpass filtered, re-enters chip 10 at pins 32 and 33, and is amplified before being down-converted to the final IF at 13.06 MHz by the second mixer 72. Automatic gain control (AGC) is preferably provided before and after the second mixer 72 to allow a gain adjustment range in excess of sixty decibels (dB). The VCO 46 is locked to a TCXO reference signal at pin 21. Compensation of the phase-locked loop is accomplished by an external resistor-capacitor network between pins 18 and 19. Pins 23 and 24, when tied with capacitors to ground, allow the DC levels at the outputs pins 25 and 26 to be the same by means of a feedback loop around the output amplifiers. Numerous independent power supply and ground pins are provided on chip 10 to give good supply decoupling between circuits. For example, the VCO, IF, RF and digital sections each have their own VCC and ground pins (17, 31, 35, 22 and 14, 34, 13, 20, respectively).

Although the present invention has been described in terms of the presently preferred embodiment, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A dual-conversion super heterodyne receiver integrated circuit device, comprising:
   a radio frequency (RF) amplifier with selection means for receiving a first frequency (F1) carrier signal and a second frequency (F2) carrier signal;
   a voltage controlled oscillator (VCO) for providing a first local oscillator (LO1) signal having a frequency of approximately (F1+F2) divided by two;
   a first mixer having inputs connected to respective outputs of the RF amplifier and the VCO and an output for a first intermediate frequency signal;
   frequency division means connected to an output of the VCO in a phase locked loop configuration and connected to derive a second local oscillator (LO2) signal from LO1 such that LO1 divided by LO2 equals "N.5", where "N" is a positive integer; and
   a second mixer having inputs derived from respective outputs of the first mixer and the frequency division means and an output for a second intermediate frequency signal.

2. The device of claim 1, wherein
   said frequency F1 is approximately equal to 1575.42 MHz and said frequency F2 is approximately equal to 1227.6 MHz;
   said first local oscillator LO1 signal is approximately equal to 1401.6 MHz; and
   said second local oscillator LO2 signal is approximately equal to 186.88 MHz and wherein said positive integer "N" is seven.

3. The device of claim 1, wherein:
   the VCO comprises an oscillator having a pair of cross-coupled amplification transistors provided for oscillator gain and a pair of feedback transistors each having its base tied to its emitter provided for capacitive positive feedback and respectively connected between the base of a first one and collector of a second one of said cross-coupled amplification transistors, wherein semiconductor process variations in the Miller capacitance of said amplification transistors are self-corrected by matching variations in the capacitance of said feedback transistors.

4. The device of claim 1, wherein:
   the frequency division mans comprises a pulse-swallowing digital divider connected for a divide by seven and one-half function.

5. A dual-conversion super heterodyne receiver, comprising:
   a radio frequency (RF) amplifier;
   a first mixer coupled to an output of the RF amplifier for providing a first intermediate frequency output;
   a phase locked loop (PLL) including a voltage controlled oscillator (VCO) with an output connected to the first mixer, a numerical counter and a phase-frequency detector for comparing an output of said numerical counter to a reference frequency for phase locked loop operation;
   a divide by seven and one-half pulse-swallowing counter having an input connected to the PLL and a second local oscillator output for deriving a second local oscillator frequency one seven and a half part of said first local oscillator frequency;
   a second mixer having respective inputs connected to receive said first intermediate frequency from said first mixer and a second local oscillator signal from said second local oscillator output for providing an output for a second intermediate frequency; and
   an output stage with low-pass filtering and automatic gain control connected to said second intermediate frequency output of the second mixer.

6. A voltage controlled oscillator (VCO), comprising:
   a pair of cross-coupled amplification transistors provided for oscillator gain and a pair of feedback transistors each having its base tied to its emitter provided for capacitive positive feedback and respectively connected between the base of a first one and collector of a second one of said cross-coupled amplification transistors, wherein semiconductor process variations in the Miller capacitance of said amplification transistors is self-corrected by matching variations in the capacitance of said feedback transistors.

7. A phase locked loop (PLL), comprising:
   a voltage controlled oscillator (VCO) with an astable multivibrator including a pair of cross-coupled amplification transistors provided for oscillator gain and a pair of feedback transistors each having its base tied to its emitter provided for capacitive positive feedback and respectively connected between the base of a first one and collector of a second one of said cross-coupled amplification transistors, wherein semiconductor process variations in the Miller capacitance of said amplification transistors is self-corrected by matching variations in the capacitance of said feedback transistors;
   a numeric counter means connected to divide down a sample of an output frequency produced by the VCO; and
   a phase-frequency detector connected to compare an output of the numeric counter to an externally provided reference frequency and connected to lock an operating frequency of the VCO to said reference frequency.

8. The PLL of claim 7, wherein:
   the numeric counter means comprises a pulse-swallowing digital divider that is connected to divide an input signal by seven and one-half.

9. The PLL of claim 8, wherein:
   said pulse-swallowing digital divider includes a first D-type flip-flop and a second D-type flip-flop with an XOR-gate connected between an D-input of said second D-type flip-flop and a Q-output of said first D-type flip-flop for controlling the number of input clock transitions required to cycle both said first and second D-type flip-flops.

* * * * *